United States Patent
Sikina et al.

(10) Patent No.: US 9,974,160 B1
(45) Date of Patent: May 15, 2018

(54) INTERCONNECTION SYSTEM FOR A MULTILAYERED RADIO FREQUENCY CIRCUIT AND METHOD OF FABRICATION

(71) Applicant: Raytheon Company, Waltham, MA (US)

(72) Inventors: Thomas V. Sikina, Acton, MA (US); Mary K. Herndon, Littleton, MA (US); John P. Haven, Lowell, MA (US); Alkim Akyurtlu, Arlington, MA (US)

(73) Assignee: Raytheon Company, Waltham, MA (US)

( * ) Notice: Subject to any disclaimer, the term of this patent is extended or adjusted under 35 U.S.C. 154(b) by 0 days. days.

(21) Appl. No.: 15/392,142

(22) Filed: Dec. 28, 2016

(51) Int. Cl.
| | |
|---|---|
| *H01P 3/08* | (2006.01) |
| *H05K 1/02* | (2006.01) |
| *H05K 1/11* | (2006.01) |
| *H05K 3/46* | (2006.01) |
| *H05K 3/40* | (2006.01) |

(52) U.S. Cl.
CPC ............ *H05K 1/0237* (2013.01); *H01P 3/08* (2013.01); *H01P 3/085* (2013.01); *H05K 1/11* (2013.01); *H05K 3/40* (2013.01); *H05K 3/46* (2013.01)

(58) Field of Classification Search
CPC .......... H05K 1/0237; H05K 1/11; H05K 3/40; H05K 3/46; H01P 3/08; H01P 3/085; H03H 7/38
USPC ..................................... 333/246, 238, 33, 260
See application file for complete search history.

(56) References Cited

U.S. PATENT DOCUMENTS

| | | | |
|---|---|---|---|
| 5,699,234 A | 12/1997 | Saia et al. | |
| 2003/0218515 A1* | 11/2003 | Tamaki | H01P 5/085 333/33 |
| 2005/0098348 A1 | 5/2005 | Okumichi et al. | |
| 2009/0000106 A1 | 1/2009 | Chuang et al. | |
| 2009/0267712 A1* | 10/2009 | Zhou | H01P 1/04 333/238 |
| 2009/0309679 A1* | 12/2009 | Kikuchi | H01P 3/003 333/238 |

(Continued)

OTHER PUBLICATIONS

PCT International Search Report dated Mar. 21, 2018 for International Application No. PCT/US2017/068075; 6 pages.
(Continued)

*Primary Examiner* — Stephen E Jones
(74) *Attorney, Agent, or Firm* — Daly, Crowley, Mofford & Durkee, LLP

(57) ABSTRACT

Systems and methods described herein are provided for electrically coupling conductors within a multilayered printed circuit board (PCB) using an interconnect formed along an outer surface of one or more stripline boards making up the multilayered PCB. The multilayered PCB may include first and second stripline boards each having multiple dielectric layers. A first conductor may be formed in the first stripline between the multiple dielectric layers and a second conductor may be formed in the second stripline between the multiple dielectric layers. The interconnect may be formed over an outer surface the dielectric layers such that the interconnect extends from the first conductor to the second conductor. An electrically conductive wall may be formed over the edge or side portion of the dielectric layers to form a cavity that encloses the interconnect and the outer surface of the multilayered PCB.

25 Claims, 5 Drawing Sheets

(56) References Cited

U.S. PATENT DOCUMENTS

2014/0167882 A1    6/2014   Shinoda et al.
2015/0173214 A1    6/2015   Kawazu

OTHER PUBLICATIONS

PCT Written Opinion dated Mar. 21, 2018 for International Application No. PCT/US2017/068075; 8 pages.

* cited by examiner

INTERCONNECTION SYSTEM FOR A MULTILAYERED RADIO FREQUENCY CIRCUIT AND METHOD OF FABRICATION

BACKGROUND

As is known in the art, a via refers to an electrical connection between layers in a radio frequency (RF) circuit which passes through the plane of one or more adjacent layers of a printed circuit board (PCB). Vias are widely used in PCB circuit designs to couple signal paths and components (collectively "circuitry") disposed on different layers of the PCB.

A via may include a hole or opening formed in the PCB with a conductor disposed or otherwise provided in the opening to provide an electrically conductive pathway from one end of the opening to the other. For example, in PCB designs, a via electrically connects the different layers using a hole formed through the respective boards. As the vias are formed through the PCB, they can take up valuable space within the PCB. Further, the vias may be prone to leaks resulting in areas of high field density around the location of the respective via. Thus, unrestricted fields can propagate throughout the individual layers impacting a performance of the respective PCB.

SUMMARY

Systems and methods described herein are directed towards a vertical launch interconnection (hereinafter 'interconnect') to couple different layers of a multilayered radio frequency (RF) circuit, such as a multilayered printed circuit board (PCB). The interconnect may be formed along an outer surface of one or more stripline boards making up the multilayered PCB to electrically couple conductors on the respective stripline boards. Thus, in an embodiment, the interconnect can electrically couple conductors disposed on different layers of the multilayered PCB without using holes formed through the different layers.

For example, center conductors of stripline transmission lines provided on respective ones of multiple stripline boards may be electrically coupled via an interconnect formed or otherwise disposed over an edge or side portion of dielectric layers of the multiple stripline boards such that the interconnect extends at least from a first center conductor in a first stripline board to a second center conductor in a second stripline board. In some embodiments, the interconnect may be printed onto an outer surface or edge or side portion of a stripline board using additive manufacturing techniques.

An electrically conductive wall may be formed over the edge or side portion of dielectric layers which form the stripline board to form a cavity that encloses the interconnect and the outer surface of the multilayered PCB. In some embodiments, the cavity may be air-filled or filled with dielectric material.

The conductive wall may be formed in a variety of different shapes or designs based at least in part on the location and/or dimensions of the interconnect. For example, the conductive wall may electrically isolate the interconnect from surrounding circuitry in the multilayered PCB, thereby preventing undesirable coupling of signals from "leaking" between signals paths (i.e., the conductive wall helps support and ideally eliminates "leakage" signals).

By forming the interconnect along an outer surface of the multilayered PCB, the interconnect may allow for high isolation between adjacent stripline boards and minimize system losses. Thus, the interconnect systems and methods as described herein enable design and manufacture of high-performance apertures. In some embodiments, the low loss may allow a smaller sized array to be utilized for particular applications. Further, the multilayered PCB may operate at a wide radar bandwidth.

As stated above, the interconnect may be formed using additive manufacturing techniques. The interconnect can be directly printed onto portions of an outer surface of the respective multilayered PCB. Additive manufacturing and the elimination of vias within the multilayered PCB may provide for cost savings, thus, reducing manufacturing costs as compared to PCB designs having conductive vias. For example, the systems and methods described herein may enable additive manufactured phased arrays.

In a first aspect of the concepts sought to be protected herein, a multilayered printed circuit board comprises a first stripline board having first and second opposing surfaces, the first stripline board having a first conductor formed as a first signal path within the multilayered printed circuit board and a second stripline board having first and second opposing surfaces, the second stripline board having a second conductor formed as a second signal path within the multilayered printed circuit board. The multilayered printed circuit board further comprises a conductive layer disposed between the second surface of the first stripline board and the first surface of the second stripline board, an interconnect disposed to couple the first signal path (i.e., first conductor) to the second signal path (i.e., second conductor), the interconnect disposed along portions of an outer surface of the first and second stripline boards and an electrically conductive wall formed over the outer surface of the first and second stripline boards to form a cavity which encloses the interconnect and the outer surface of the first and second stripline boards.

The first stripline board may include a first dielectric substrate disposed over a first surface of the first conductor and a second dielectric substrate disposed over a second surface of the first conductor and a first ground plane formed over a first surface of the first dielectric substrate. In some embodiments, the conductive layer may be formed over a second surface of the second dielectric substrate to form a second ground plane of the first stripline board.

The second stripline board may include a first dielectric substrate disposed over a first surface of the second conductor and a second dielectric substrate disposed over a second surface of the second conductor and a first ground plane formed over a second surface of the second dielectric substrate. The conductive layer may be formed over a first surface of the first dielectric substrate to form a second ground plane of the second stripline board.

The interconnect can be formed along an outer surface of a second dielectric substrate of the first stripline board and an outer surface of a first dielectric substrate of the second stripline board. In some embodiments, the outer surface of the second dielectric substrate of the first stripline board and the outer surface of the first dielectric substrate of the second stripline board are substantially flush. In other embodiments, the first stripline board and the second stripline board are different lengths such that the outer surface of the second dielectric substrate of the first stripline board and the outer surface of the first dielectric substrate of the second stripline board form a step shaped surface.

One or more ramps may be formed over one or more ground planes within the multilayered printed circuit board.

The interconnect can be disposed over the one or more ramps to couple the first and second conductor over the step shaped surface.

The electrically conductive wall can be coupled to the first surface of the first stripline board and the second surface of the second stripline board. The electrically conductive wall can enclose the outer surface such that the cavity is formed between the outer surface of the first and second stripline boards and an inner surface of the electrically conductive wall. Dielectric material may be disposed within the cavity.

In a second aspect, a method for forming a multilayered printed circuit board is provided. The method comprising disposing a first stripline board having first and second surfaces over a first surface of a conductive layer, the first stripline board having a first conductor, disposing a second stripline board having first and second surfaces over a second surface of the conductive layer such that conductive layer is disposed between the second surface of the first stripline board and the first surface of the second stripline board, the second stripline having a second conductor, forming an interconnect along portions of an outer surface of the first and second stripline boards to couple the first conductor to the second conductor and coupling an electrically conductive wall over the outer surface of the first and second stripline boards to form a cavity which encloses the interconnect and the outer surface of the first and second stripline boards.

In some embodiments, a first dielectric substrate can be disposed over a first surface of the first conductor, a second dielectric substrate can be disposed over a second surface of the first conductor and a first ground plane can be formed over a first surface of the first dielectric substrate. A second ground plane can be formed over a second surface of the second dielectric substrate using the conductive layer.

The method may further comprise disposing a first dielectric substrate over a first surface of the second conductor and a second dielectric substrate over a second surface of the second conductor and forming a first ground plane over a second surface of the second dielectric substrate. A second ground plane may be formed over a first surface of the first dielectric substrate using the conductive layer.

The interconnect can be disposed along an outer surface of a second dielectric substrate of the first stripline board and an outer surface of a first dielectric substrate of the second stripline board.

In some embodiments, the first stripline board and the second stripline board can be provided at different lengths such that the outer surface of the second dielectric substrate of the first stripline board and the outer surface of the first dielectric substrate of the second stripline board form a step shaped surface. One or more ramps may be formed over one or more ground planes within the multilayered printed circuit board and the interconnect may be disposed over the one or more ramps to couple the first and second conductor over the step shaped surface.

The method may further comprise coupling the electrically conductive wall to the first surface of the first stripline board and the second surface of the second stripline board. A cavity may be formed between the outer surface of the first and second stripline boards and an inner surface of the electrically conductive wall and dielectric material can be disposed within the cavity.

BRIEF DESCRIPTION OF THE DRAWINGS

The foregoing features may be more fully understood from the following description of the drawings in which.

DETAILED DESCRIPTION

Figure 1:
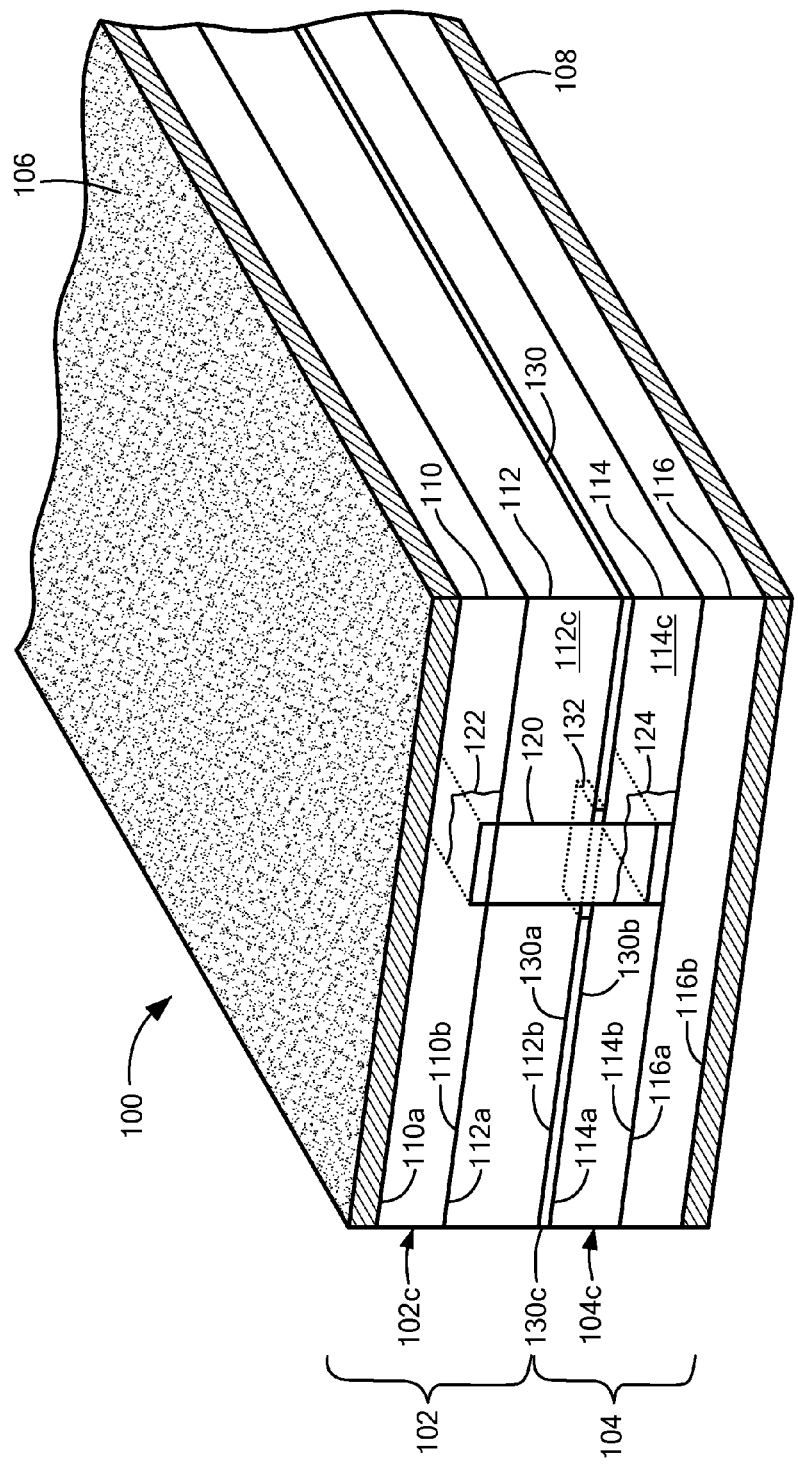
FIG. 1 is an isometric view of a multilayered printed circuit board.

The foregoing concepts and features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the concepts, systems and techniques described herein. Like numbers in the figures denote like elements.

Now referring to FIG. 0.1, a multilayered printed circuit board (PCB) 100 includes a first and second stripline transmission line boards 102, 104 with first stripline board 102 provided from a pair of dielectric substrates 110, 112 having conductive ground planes 106, 130 disposed on outer surfaces 110a, 112b thereof. Second stripline board 104 is provided from a pair of dielectric substrates 114, 116 having conductive ground planes 108, 130 disposed on outer surfaces 114a, 116b thereof. Thus, conductive layer 130 is disposed between first and second stripline boards 102, 104 and serves as a ground plane for both stripline circuit boards 102, 104 (i.e., a shaped ground plane).

A bonding layer (not visible in FIG. 1) may be disposed between first and second stripline boards 102, 104, and between stripline layers 110, 112 and 114, 116. For example, conductive layer 130 may be provided as part of substrate 112 (e.g., disposed on surfaces 112b) and a bond film or other bond material may be disposed between ground plane 130 and surface 114a of substrate 114. Those of ordinary skill in the art will appreciate that first and second stripline boards 102, 104 may be bonded together, in a variety of different techniques, as is generally known.

First stripline board 102 includes a first conductor 122 (shown here in phantom) disposed between dielectric substrates 110, 112. Conductor 122 thus corresponds to a stripline transmission line with conductors 106, 130 corresponding to ground planes.

Second stripline board 104 includes a second conductor 124 (shown here in phantom) disposed between dielectric substrates 114, 116. Second conductor 124 corresponds to a second stripline transmission line with conductors 108, 130 corresponding to ground planes.

An interconnect 120 couples first conductor 122 to second conductor 124. Interconnect 120 can be disposed along portions of outer surfaces 102c, 104c of first and second stripline boards 102,104. For example, interconnect 120 can be disposed over an outer surface 112c of second dielectric substrate 112 of first stripline board 102 and an outer surface 114c of first dielectric substrate 114 of second stripline board 104. In some embodiments, interconnect 120 can be formed along one side or edge of multilayered PCB 100.

In some embodiments, a cut-out 132 may be formed on an edge 130c (e.g., side portion) of conductive layer 130 to ensure that interconnect 120 does not contact conductive layer 130. For example, as interconnect 120 couples first conductor 122 to second conductor 124, a portion of interconnect 120 may pass by edge 130c of conductive layer 130. Cut-out 132 may be formed along edge 130c such that it is adjacent to the portion of interconnect 120 that passes by edge 130c. The dimensions (e.g., width, length) of cut-out 132 can correspond to the dimensions (e.g., width, length) and be selected such that interconnect 120 does not contact conductive layer 130. In some embodiments, cut-out 132 may be filled with dielectric material and interconnect 120 may be formed on or otherwise disposed over the dielectric material within cut-out 132.

Interconnect 120 may be provided having dimensions suitable to couple radio frequency (RF) signals between the first and second conductors 122, 124, of first and second stripline boards 102, 104 respectively. Thus, first and second conductors 122, 124 correspond to center conductors of stripline transmission lines provided in the first and second stripline boards 102, 104 respectively along which RF signals may propagate.

Interconnect 120 may be provided from any suitable conductive material or otherwise disposed or otherwise provided on surfaces of dielectric substrates 110, 112, 114, 116. For example, in one embodiment, interconnect 120 can be disposed onto a surface of one or more dielectric substrates 110, 112, 114, 116 using pick and place machines and techniques. In some embodiments, interconnect 120 may be printed onto a surface of one or more dielectric substrates 110, 112, 114, 116 using additive manufacturing techniques. For example, interconnect 120 may include various types of conductive inks that may be printed onto the exposed conductors and dielectric surfaces.

Interconnect 120 may be referred to herein as a vertical interconnect. However, it should be appreciated that vertical interconnect, as used herein, refers to an interconnect that couples signal paths of different layers of a PCB regardless of an orientation of the PCB or individual stripline boards making up the PCB. Thus, vertical interconnect may include interconnects having horizontal or other orientations. Further, vertical interconnect may include interconnects having a combination of different orientations, such as but not limited to, an interconnect having vertical and horizontal components.

Dielectric substrates 110, 112, 114, 116 may be provided from low dielectric constant polytetrafluoroethane (PTFE) based materials. Thus, the first and second stripline boards may be provided as PTFE based circuit boards. In some embodiments, dielectric substrates 110, 112, 114, 116 may be provided from the same materials. In some embodiments, dielectric substrates 110, 112, 114, 116 may be provided from one or more different materials.

As will be explained in detail below, an electrically conductive wall (not shown in FIG. 1) may be formed over the outer surfaces 102c, 104c of the first and second stripline boards 102, 104 to form a cavity which encloses the interconnect 120 and the outer surface 102c, 104c, of the first and second stripline boards 102, 104 respectively.

Figure 2:
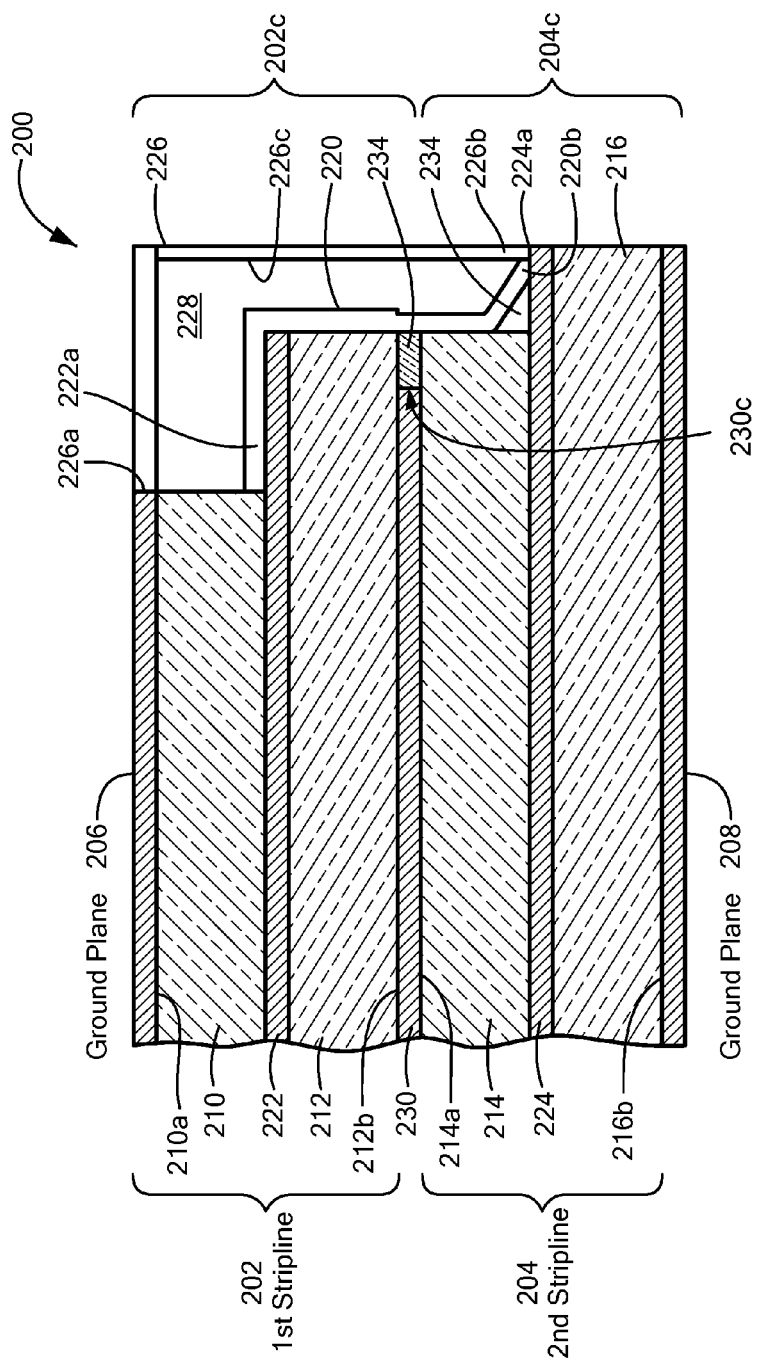
FIG. 2 is a side view of a multilayered printed circuit board.

For example, and now referring to FIG. 2, a multilayered PCB 200 includes a first and second stripline boards 202, 204 with first stripline board 202 provided from dielectric substrates 210, 212 having conductive ground planes 206, 230 disposed on outer surfaces 210a, 212b thereof. Second stripline board 204 is provided from dielectric substrates 214, 216 having conductive ground planes 230, 208 disposed on outer surfaces 214a, 216b thereof. Thus, conductive layer 230 is disposed between first and second stripline boards 202, 204 and serves as a ground plane for both stripline circuit boards 202, 204.

First stripline board 202 includes a first conductor 222 and second stripline board 204 includes a second conductor 224, each of which may correspond to RF signal paths. An interconnect 220 couples the first conductor 222 to the second conductor 224.

An electrically conductive wall (hereinafter 'conductive wall') 226 is formed over an outer surface 202c, 204c of first and second stripline boards 202, 204 to form a cavity 228 which encloses interconnect 220 and the outer surfaces 202c, 204c. In an embodiment, conductive wall 226 may be formed on or otherwise disposed over at least one surface (e.g., edge, side, etc.) of multilayered PCB 200 such that it encloses interconnect 220 and the outer surfaces 202c, 204c. For example, a first end 226a of conductive wall 226 may be coupled to first ground plane 206 and a second end 226b of conductive wall 226 may be coupled to second ground plane 208.

Conductive wall 226 can be formed such that it encloses a spatial area around interconnect 220 and does not contact interconnect 220. Conductive wall 226 and cavity 228 can be formed using subtractive manufacturing techniques. For example, the cavity 228 may be formed using subtractive manufacturing and conductive wall 226 can be printed over cavity 228. Cavity 228 may include or otherwise be filled a media that is substantially the same as the material from which dielectric substrates 210, 212, 214, 216 are provided from. In an embodiment, the dimensions of the conductive wall 226 can be selected such that the dimensions are less than 0.1 of wavelengths in the cavity 228 inner (filled) media material.

First end 226a is electrically coupled to a top surface of first ground plane 206 and second end 226a is electrically coupled to a surface of second dielectric substrate 216 or a bottom surface of second ground plane 208. Conductive wall 226 may be disposed such that it is flush or substantially flush with a top surface of first and second ground planes 206, 208. For example, first end 226a may be coupled to an edge of first ground plane 206 such that it extends from the edge of first ground plane 206 and second end 226a may be coupled to an edge of second ground plane 208 such that it extends from the edge of second ground plane 208.

In other embodiments, first end 226a of conductive wall 226 may be coupled to first dielectric substrate 210 and second end 226b of conductive wall 226 may be coupled to second dielectric substrate 216.

A ramp 234 may be formed over a portion of first surface 224a of second conductor 224 and aid interconnect 220 in coupling first and second conductors 222, 224. Ramp 234 can be disposed over the surface 224a of second conductor such that it facilitates the mechanical transition of the interconnect 220 from a vertical surface to horizontal surface 224a. For example, ramp 234 may have a shape designed to generally guide interconnect 220 from the outer surface 202c of first stripline board 202 to first surface 224a of second conductor 224. In some embodiments, ramp 234 has at least one of a ramp shape, triangle shape, wedge shape.

In some embodiments, a ramp 234 provided from a dielectric material may be provided on one end 230c of conductive layer 230 such that the dielectric material is disposed between the end 230c and interconnect 220. In some embodiments, the ramp 234 (e.g., dielectric material) may insulate interconnect 220 from conductive layer 230. Thus, in an embodiment, interconnect 220 is in contact with first and second conductors 222, 224 and not in contact with conductive layer 230.

The electrically conductive wall 226 and cavity 228 can be configured to electrically isolate interconnect 220 from circuitry within multilayered PCB 200. For example, cavity 228 may include or be filled with dielectric material. The dielectric material may be disposed between interconnect 220, outer surfaces 202c, 204c of the first and second stripline boards and an inner surface 226c of conductive wall 226.

As illustrated in FIG. 2, interconnect 220 may extend from a first end 222a of first conductor 222 to a first end 224a of second conductor 224. Thus, interconnect 220 (also referred to as a vertical RF interconnect) provides a signal path along which RF signals may be coupled from a first transmission line (i.e., first conductor 222) of first stripline board 202 to a second transmission line (i.e., conductor 224) of second stripline board 204. Thus, vertical interconnect couples RF signals from one layer of multilayer circuit board 200 to a second, different layer of circuit board 200. It should be appreciated that in the embodiments shown in FIG. 2, as well as FIGS. 1, 2A and 3, first and second conductors 222, 224 respectively correspond to RF transmission lines, as well as center conductors of a stripline transmission line of first and second stripline boards 202, 204 respectively.

Figure 2A:
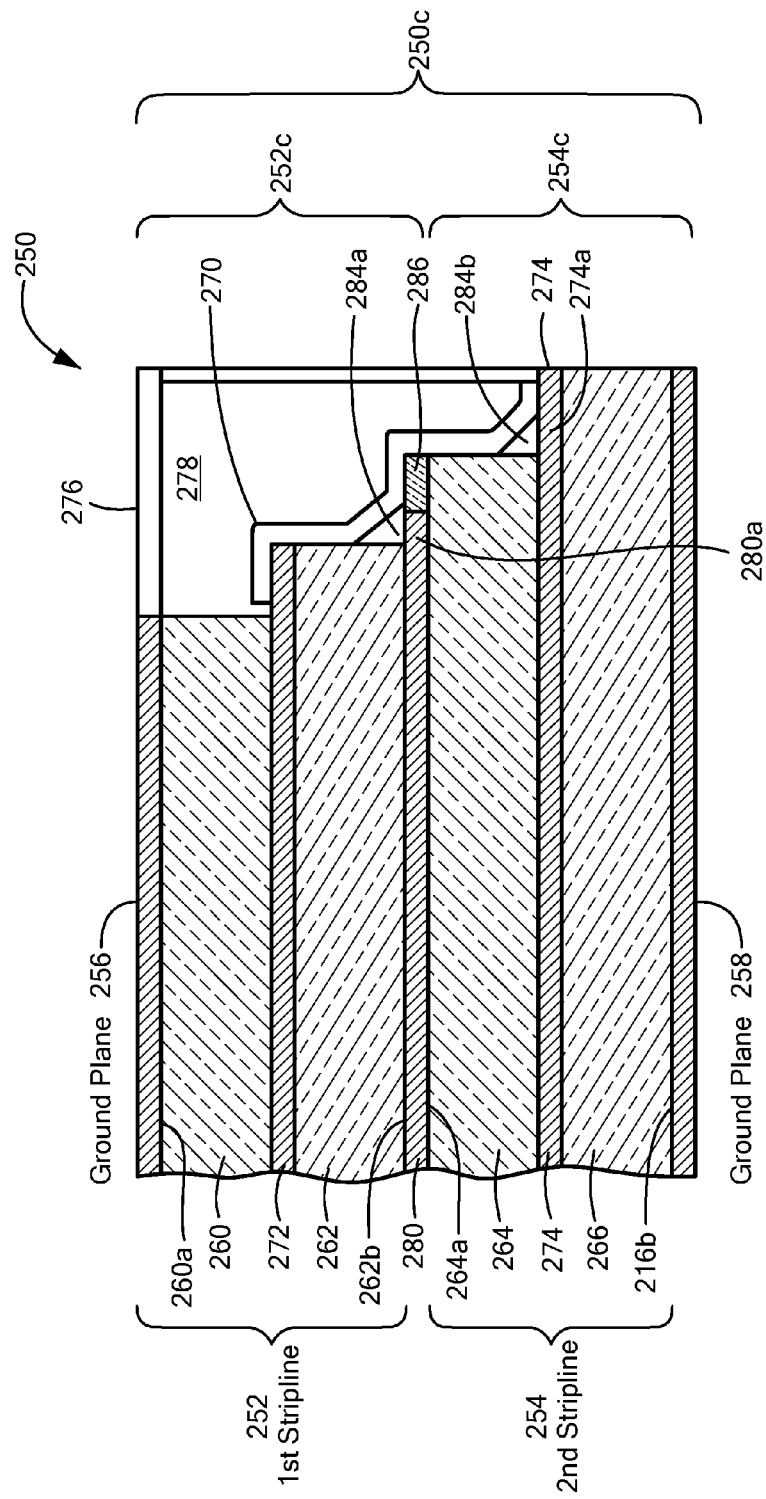
FIG. 2A is a side view of a multilayered printed circuit board of FIG. 1 having a step shaped outer surface.

Now referring to FIG. 2A, a multilayered PCB 250 includes a conductor 280 disposed between first and second stripline boards 252, 254. First stripline board 252 provided from dielectric substrates 260, 262 having conductive ground planes 256, 280 disposed on outer surfaces 260a, 262b thereof. Second stripline board 254 is provided from dielectric substrates 264, 266 having conductive ground planes 280, 258 disposed on outer surfaces 264a, 266b thereof. Thus, conductive layer 280 is disposed between first and second stripline boards 252, 254 and serves as a ground plane for both stripline circuit boards 252, 254.

First stripline board 252 includes a first conductor 272 and second stripline board 254 includes a second conductor 274, each of which may correspond to RF signal paths. An interconnect 270 couples the first conductor 272 to the second conductor 274.

Multilayered PCB 250 may be substantially similar to multilayered PCB 200 of FIG. 2, however at least one surface 250c (e.g., edge, side, etc.) of multilayered PCB 250 has a generally step shape.

As illustrated in FIG. 2A, multilayered PCB 250 may include multiple dielectric substrates 260, 262, 264, 266 each having different dimensions (e.g., length, width). For example, first stripline board 252 includes a first dielectric substrate 260 having a first length and a second dielectric substrate 262 having a second length. Second stripline board 254 includes a first dielectric substrate 264 having a third length and a fourth dielectric substrate 262 having a fourth length. One or more of dielectric substrates 260, 262, 264, 266 may have different lengths, thus one or more of the first, second, third and/or fourth lengths may be different. In some embodiments, each of dielectric substrates 260, 262, 264, 266 have different lengths, thus each of the first, second, third and fourth lengths may be different to provide step shaped surface 250c.

First conductor 272 may be formed or otherwise disposed over a first surface of second dielectric substrate 262 such that first conductor 272 has a length equal to the length of second dielectric substrate 262.

Second conductor 274 may be formed or otherwise disposed over a first surface of second dielectric substrate 266 such that second conductor 274 has a length equal to the length of second dielectric substrate 266.

Interconnect 270 may be formed on or otherwise disposed over the step shaped surface 250c of multilayered PCB 250 to couple first and second conductors 272, 274.

One or more ramps 284a, 284b may be formed on different surfaces within multilayered PCB 250 to guide interconnect 270 along the step shaped surface from first conductor 272 to second conductor 274. For example, a first ramp 284a may be formed on a first surface 280a of conductive layer 280 and a second ramp 284b may be formed on a first surface 274a of second conductor 274.

It should be appreciated that although FIG. 2A illustrates two ramps 284a, 284b formed within multilayered PCB 250, any number of ramps may be formed within a multilayered PCB depending at least in part on the dimensions of the respective multilayered PCB and/or a number of steps formed by a surface of the respective multilayered PCB.

Ramps 284a, 284b may include dielectric material. Ramps 284a, 284b may be formed in a variety of different shapes, including but not limited to, a triangle, a wedge, square, rectangle, etc. The shape of the ramps 284a, 284b may be based at least in part on the dimensions of the respective multilayered PCB and/or how an interconnect is coupled to a surface of the respective multilayered PCB.

Conductive wall 276 may be formed over the outer surfaces 252c, 254c of first and second stripline boards 252, 254 respectively to form a cavity 278 which encloses interconnect 270 and outer surfaces 252c, 254c.

Figure 3:
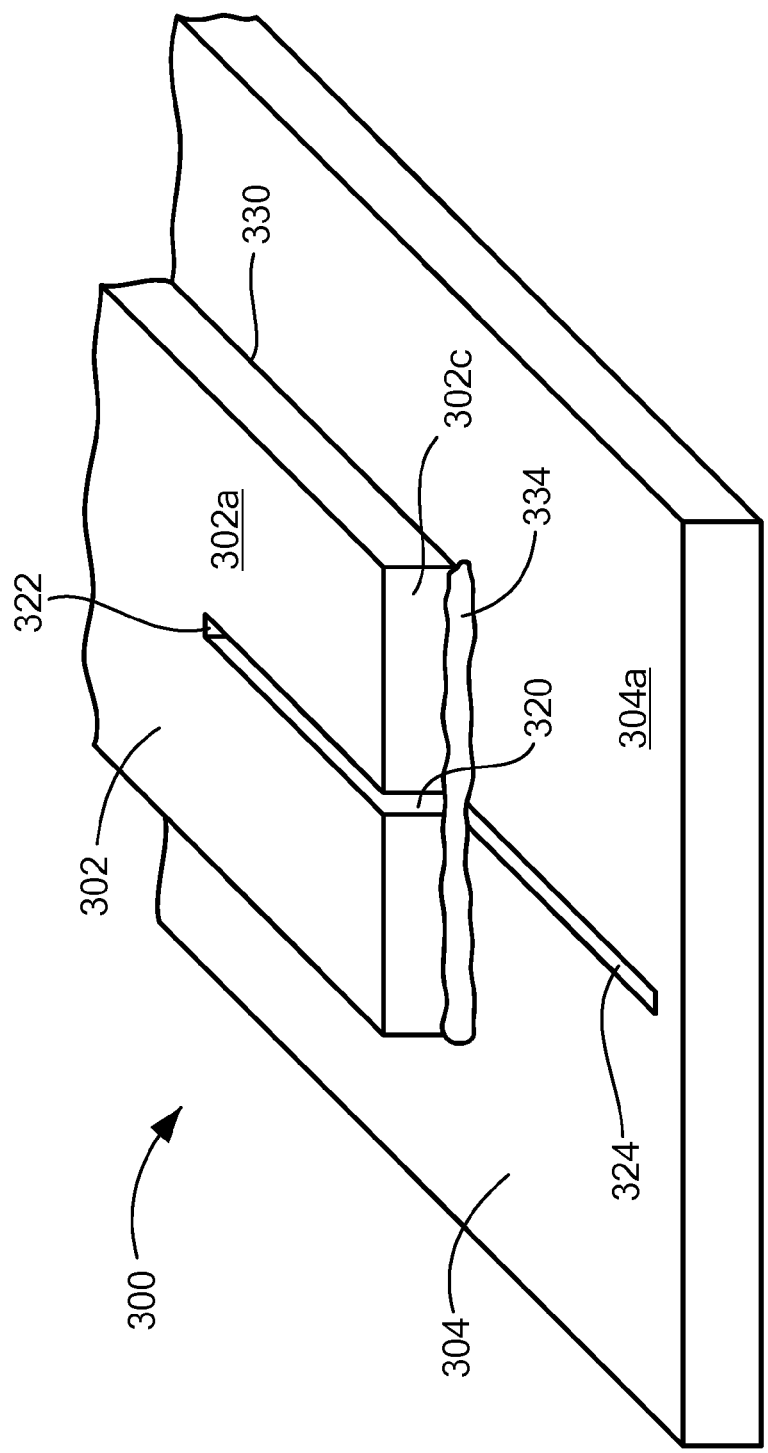
FIG. 3 is an isometric view of a multilayered printed circuit board having a stripline configuration.

Now referring to FIG. 3, a multilayered PCB 300 has portions thereof removed to reveal a first stripline board 302 and a second stripline board 304. It should be noted that for clarity in the figure and following description, certain dielectric layers and ground planes have been omitted from FIG. 3.

First and second stripline boards 302, 304 may include dielectric materials, such as but not limited to, Rogers 4003 Laminates®. First and second stripline boards 302, 304 can be bonded together by a bond film 330, such as but not limited to a conductive epoxy bond film or a pressure sensitive adhesive (PSA) film.

A first conductor 322 may be formed on or otherwise disposed over a first surface 302a of first stripline board 302 and a second conductor 324 may be formed on or otherwise disposed over a first surface 304a of second stripline board 304. First and second conductors 322, 324 may be formed In some embodiments, first and second conductors 322, 324 may be printed onto first surface 302a of first stripline board 302 and first surface 304a of second stripline board 304, respectively. For example, first and second conductors 322, 324 may include an ink stripline (e.g., Pam ink stripline) and can be printed through additive manufacturing techniques.

First and second conductors may be electrically coupled together through an interconnect 320. Interconnect 320 may be formed on or otherwise disposed over an outer surface 302c of first stripline board 302. In some embodiments, interconnect 320 may be printed onto outer surface 302c of first stripline board 302 through techniques such as additive manufacturing.

A ramp 334 may be formed over a portion of first surface 304a of second stripline board 304 to guide and aid interconnect 320 in coupling first and second conductors 322, 324. For example, ramp 334 may be formed such that it is disposed over a bottom portion of outer surface 302c of first stripline board 302 and first surface 304a of second stripline board 304. Ramp 334 may have a shape designed to generally guide interconnect 320 from the outer surface 302c of first stripline board 302 to first surface 304a of second stripline board 304. In some embodiments, ramp 334 has at least one of a ramp shape, triangle shape, wedge shape.

In some embodiments, ramp 334 may be printed onto the outer surface 302c of first stripline board 302 and/or first surface 304a of second stripline board 304. For example, ramp 334 may include ink materials (e.g., creative materials inks) and can be printed through additive manufacturing techniques.

Figure 4:
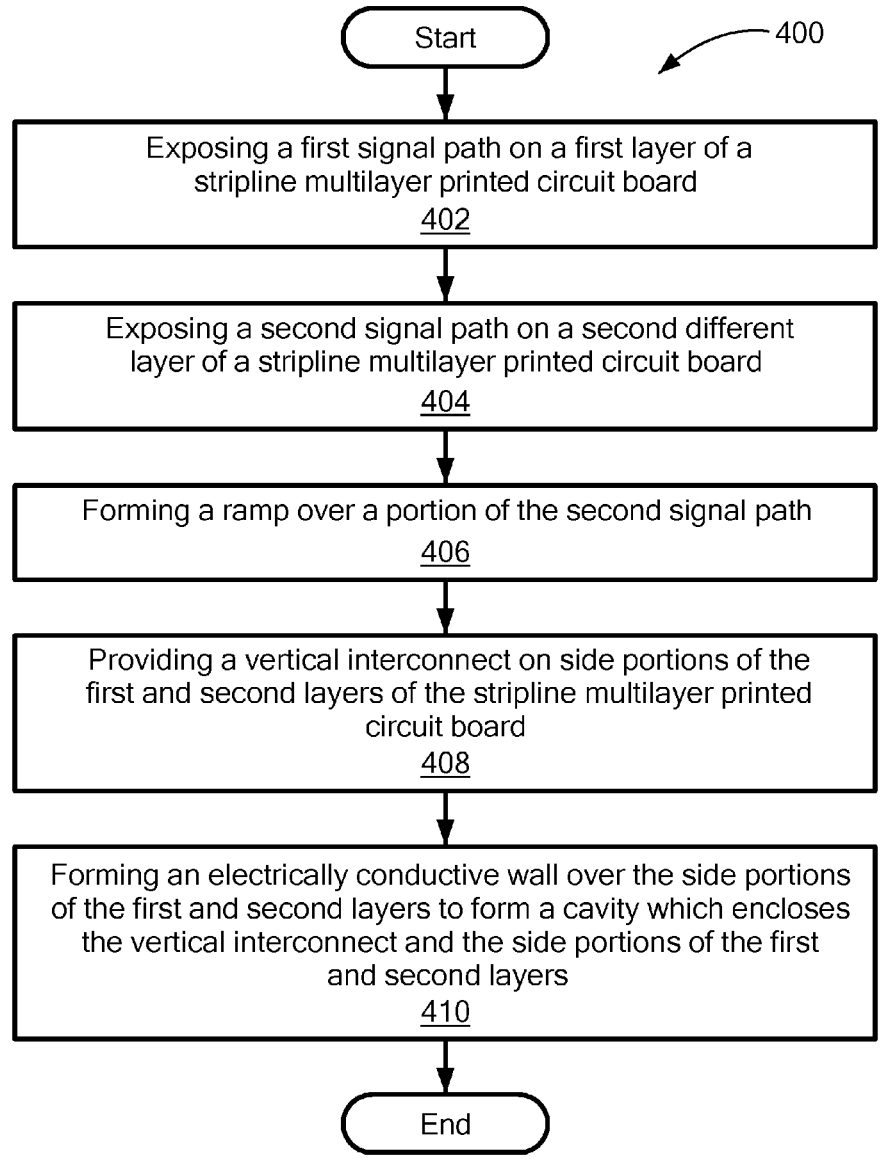
FIG. 4 is a flow diagram of a method for fabricating a multilayered printed circuit board.

Now referring to FIG. 4, a method 400 for forming a vertical interconnect on a multilayered PCB begins at block 402, by exposing a first signal path on a first layer of a stripline multilayer PCB. The first signal path in the first layer may be exposed to allow for a connection to be made to a different layer within the multilayered PCB.

The stripline multilayer PCB may include multiple layers with each layer having stripline boards. For example, in some embodiments, a first stripline board (referred to herein as first stripline board, first layer or top stripline board) having a conductor (referred to herein as first conductor) may be provided as a first layer of the stripline multilayer PCB. The first stripline board (referred to herein as first stripline board or top stripline board) is formed on or otherwise disposed over a first surface of a conductive layer. The first stripline board may include multiple layers of dielectric material. For example, the first stripline board may include first and second dielectric substrates. A second surface of the second dielectric substrate may be disposed on the first surface of the conductive layer. In some embodiments, the conductive layer may be provided as a ground plane for the first stripline board.

The first conductor is disposed between the dielectric layers. For example, the first conductor may be formed over a first surface of the second dielectric substrate and under a second surface of a first dielectric substrate of the first stripline board. The first conductor can be formed as an RF signal path within first stripline board, such as a center conductor of a stripline transmission line. Thus, the conductor may be referred to herein as a first signal path.

To expose the first signal path, a portion of the dielectric material of the first stripline board may be removed. For example, a portion of the first dielectric substrate may be removed to expose a portion of a first surface of the first signal path. The amount removed may vary, based at least in part on how an interconnect is coupled to the first signal path and how much surface area of first signal path is used to couple to the interconnect.

The first stripline board may be formed such that the first signal path is exposed. For example, the dielectric material may be provided below the first signal path, however, a portion of a top surface of the first signal path may not be covered by dielectric material and thus be exposed.

A conductor may be disposed over a first surface of the first dielectric layer. The conductor may be provided as a ground plane and include any known conductive materials.

At block 404, a second signal path is exposed on a second different layer of the stripline multilayer printed circuit board. The second signal path corresponds to a second conductor within the multilayered PCB. For example, a second stripline board (referred to herein as second stripline board or bottom stripline board) having a conductor (referred to herein as second conductor) may be provided as a second layer of the stripline multilayer PCB. The second stripline board may include dielectric layers and the second conductor may be disposed between the dielectric layers.

The second conductor can be disposed over a first surface of a second dielectric substrate with the second dielectric substrate serving as a base or bottom portion for the second stripline board. A first dielectric substrate can be disposed over a first surface of the second conductor with the first dielectric substrate serving as a top portion of the second stripline board. The second conductor can be formed as an RF signal path within second stripline board, such as a center conductor of a stripline transmission line.

A portion of the dielectric material of the second stripline board may be removed to expose a portion of the second signal path. For example, a portion of the first dielectric substrate may be removed to expose a portion of a first surface of the second signal path. The amount removed may vary, based at least in part on how the interconnect is coupled to the second signal path and how much surface area of second signal path is used to couple to the interconnect.

In some embodiments, the second stripline board may be formed such that the second signal path is exposed. For example, the dielectric material may be provided below the second signal path, however, a portion of a top surface of the second signal path may not be covered by dielectric material and thus be exposed.

A conductor may be disposed over a second surface of the second dielectric layer. The conductor may be provided as a ground plane and include any known conductive materials.

The conductive layer can be formed on or otherwise disposed over a first surface of the second stripline board. In some embodiments, the conductive layer may be provided as a ground plane for the second stripline board. The conductive layer may be formed such that it separates different layers within the multilayered PCB (i.e., between a first and second stripline board).

In some embodiments, a bonding layer may be disposed between first and second stripline boards. For example, the conductive layer may be provided as part of a dielectric substrate in the first and/or second stripline board and a bond film or other bond material may be disposed between the conductive layer and the surface of dielectric substrates of first and/or second stripline boards.

In some embodiments, the layers and thus the stripline boards may be formed having equal dimensions (e.g., length, height, width). For example, the first and second stripline boards may be formed such they have equal lengths and the outer surfaces (e.g., a side portion, an edge) of the first and second stripline boards are substantially flush.

Thus, the dielectric layers of the first and second stripline boards may be formed having equal dimensions. In an embodiment, the first and second dielectric substrates of the first stripline board and the first and second dielectric substrates of the second stripline board may have equal dimensions such that ends or side portions of the dielectric substrates are substantially flush.

In some embodiments, the layers and thus the stripline boards may be formed having different dimensions (e.g., length, height, width). For example, the first and second stripline boards may be formed such they have different lengths and the outer surfaces of the first and second stripline boards form a step shaped surface.

Thus, the dielectric layers may be formed having different dimensions. In an embodiment, one or more of the first and second dielectric substrates of the first stripline board and the first and second dielectric substrates of the second stripline board may have different dimensions such that ends or side portions of the dielectric substrates form a step shape. In some embodiments, each of the dielectric substrates have different dimensions.

The first stripline board and the second stripline board may serve as common building blocks for the multilayered PCB. Those skilled in the art will appreciate, the first and second stripline boards can be fabricated from virtually any PTFE based material having the desired microwave properties. For example, in some embodiments, the individual stripline boards within the multilayered PCB can be fabricated with material reinforced with woven glass cloth.

In some embodiments, the first and second stripline boards can be fabricated separately and then coupled via the conductive layer to provide the multilayered PCB. Thus, the conductive layer can correspond to a bonding layer. For example, in one embodiment, the conductive layer may include Cyanate Ester resin B-stage (e.g. the type manufactured by W. L. Gore & Associates and sold under the trade name Speedboard-C®). Thus, the first and second stripline boards can be bonded or otherwise secured together to provide the multilayered PCB.

Those of ordinary skill in the art will appreciate, of course, that any other bonding or fastening technique well known to those of ordinary skill in art and appropriate for securing together microwave circuit subassemblies may also be used. It should be appreciated that in some embodiments, the multilayered PCB may be provided as a bonded assembly. However, in other embodiments, the multilayered PCB can be the result of multiple lamination, bonding and assembly processes.

The multi-step lamination, fabrication and assembly process for the multilayered PCB can provide several advantages: (a) each subassembly (e.g., individual stripline boards) may be separately tested and any subassembly which does not meet or exceed desired electrical and/or mechanical performance characteristics may be identified and either repaired or not used to form multilayered PCB; (b) separate fabrication of the individual stripline boards allows the fabrication process for each stripline board to be separately optimized for maximum yield of that respective stripline board; (c) since only known "good" stripline boards are used to fabricate multilayered PCB, this results in a high-yield multilayered PCB fabrication process; and (d) separate fabrication of stripline boards which are then secured together via bonding layers results in a wider choice of bonding adhesives and bonding temperatures for each stripline board, which leads to improved mechanical performance for each stripline board. Thus, the fabrication and assembly approach developed for the multilayered PCB produces a robust mechanical design that significantly improves manufacturing yield.

Furthermore, with the above-described multi-step lamination and fabrication process, each circuit layer of the multilayered PCB can be fabricated using PCB industry standard processes and fabrication tolerances and commercially available materials.

At block 406, a ramp may be formed over a portion of the second signal path. For example, one or more ramps may be formed on different layers of the multilayered PCB to facilitate the transition of an interconnect from different surfaces of the different layers, for example, from a substantially vertical surface to a substantially horizontal surface.

In some embodiments, the different layers of the multilayered PCB may form a step shaped surface along a side portion or edge of the multilayered PCB. One or more ramps may be disposed on one or more surfaces of the dielectric substrates to guide the interconnect along the step shaped surface. The ramps may be provided to provide a ramp like structure for the interconnect to flow from one layer to a next, different layer, such as from one dielectric substrate to another dielectric substrate, or from one conductor to a second different conductor within the multilayered PCB.

The ramps may be formed from and include dielectric material. The ramps may be formed in a variety of different shapes, for example, the shape of a particular ramp may be based at least in part on the dimensions of the different dielectric substrates within the multilayered PCB. Further, one ramp or multiple ramps may be formed in a multilayered PCB based at least in part on a number of steps formed and/or the dimensions of the different dielectric substrates within the multilayered PCB.

It should be appreciated that dielectric material may be provided on one end or side of the conductive layer disposed between the first and second stripline boards to insulate the interconnect from the conductive layer as the interconnect extends along the outer surfaces of the first and second stripline boards. For example, the dielectric material may be disposed between the interconnect and the conductive layer such that the interconnect does not contact the conductive layer between the first and second stripline boards.

It should be appreciated that the ramp can be optional and thus, in some embodiments, a ramp is not used and the multilayered PCB may not include a ramp.

At block 408, providing a vertical interconnect on side portions of the first and second layers of the stripline multilayer PCB.

The vertical interconnect can be formed along portions of an outer surface of the first and second layers to electrically couple the first and second signal paths. The vertical interconnect can be disposed on or otherwise formed on outer surfaces, such as an edge or side portion, of the dielectric layers of the first and second stripline boards. For example, the interconnect can extend from the first conductor, along a side portion of the second dielectric substrate of the first stripline board and a side portion of the first dielectric substrate of the second stripline board to the second conductor.

The shape or configuration of the interconnect may depend at least in part on the shape of the outer surface of the different layers of the multilayered PCB. The shape of the interconnect may include, but not be limited to, a cylindrical shape, part cylindrical shape, rectangular shape, part rectangular shape, a shape that is conformal to a surface of the first and second dielectric stripline boards (e.g., conformal to a side portion, edge) or any combination of these. For example, if the first and second stripline boards are formed such that they have equal dimensions and one outer surface (e.g., one side) of each of the first and second stripline boards are flush, the interconnect may be provided in a generally vertical direction along the outer surfaces. For example, the interconnect may be positioned such that it is perpendicular to the outer surfaces of each of the first and second stripline boards.

If the first and second stripline boards are formed such that they have different dimensions and one outer surface (e.g., one side) of each of the first and second stripline boards are not aligned and thus form a step shape, the interconnect may be formed over or otherwise disposed on the step shaped surface. Thus, in some embodiments, the interconnect may be formed such that its respective shape includes multiple orientations (e.g., substantially vertical portions, substantially horizontal portions, portions at or near an angle ranging from about 0° to about 90°, etc.).

The vertical interconnect may be a conductor provided from any suitable conductive material or otherwise disposed on surfaces of the dielectric substrates. In some embodiments, the vertical interconnect may be printed onto a surface of one or more dielectric substrates using additive manufacturing techniques. For example, the vertical interconnect may include various types of conductive inks.

At block 410, an electrically conductive wall is formed over the side portions of the first and second layers to form a cavity which encloses the vertical interconnect and the side portions of the first and second layers.

The conductive wall can be formed or otherwise disposed over an edge or side of the multilayered PCB such that it encloses one side or edge of each of the first and second stripline boards. A first end of the conductive wall can be coupled to the first (or top) ground plane disposed over the first surface of the first stripline board and a second end of the conductive wall can be coupled to the second (or bottom) ground plane disposed over (or under) the second surface of the second stripline board. Thus, in some embodiments, the conductive wall can extend an entire height (or length) of one side of the multilayered PCB, from the top ground plane to the bottom ground plane.

The first end of the conductive wall may be coupled to a top surface of first ground plane and second end may be coupled to a bottom surface of second ground plane. In some embodiments, the first end may be coupled to an edge of first ground plane such that it extends from the edge of first ground plane and second end may be coupled to an edge of second ground plane such that it extends from the edge of second ground plane. Thus, the conductive wall may be coupled such that it is flush or substantially flush with a top surface of first and a bottom surface of second ground plane.

The conductive wall can be formed such that it encloses a spatial area around the interconnect and does not contact the interconnect. The conductive wall and resulting cavity can be formed using subtractive manufacturing techniques. For example, the cavity may be formed using subtractive manufacturing and the conductive wall can be printed over the material making up the cavity. The cavity may include or otherwise be filled a media that is substantially the same as the material from which the dielectric substrates are provided from.

In some embodiments, a cut-out may be formed on an edge or side portion of the conductive layer to ensure that the interconnect does not contact the conductive layer. For example, as the interconnect couples the first signal path to the second signal path, a portion of the interconnect may pass by an edge or side portion of the conductive layer. The cut-out may be formed along the edge or side portion such that it is adjacent to the portion of the interconnect that passes by the edge or side portion. The dimensions (e.g., width, length) of the cut-out can correspond to the dimensions (e.g., width, length) and be selected such that the interconnect does not contact the conductive layer. In some embodiments, the cut-out may be filled with dielectric material and the interconnect may be formed on or otherwise disposed over the dielectric material within the cut-out.

The conductive wall may be formed such that it resides within an assembly that houses a multilayered PCB or within the multilayered PCB itself. For example, the conductive wall may be formed such that it resides within the multilayered PCB assembly and is surrounded by dielectric material that forms an outer surface or edge of the multilayered PCB. Thus, in such an embodiment, the conductive wall does not form an edge or outer surface of the multilayered PCB.

It should be appreciated that the conductive wall may be formed to protect and/or insulate the interconnect and thus may be formed in a variety of different shapes or designs based at least in part on the location and/or dimensions of the interconnect. The conductive wall may insulate the interconnect from surrounding circuitry in the multilayered PCB, thereby preventing signals from "leaking" between signals paths. For example, the conductive wall may be formed having, but not limited to, a cylindrical shape, part cylindrical shape, rectangular shape, part rectangular shape, a shape that is conformal to a surface of the multilayered printed circuit board (e.g., conformal to a side portion) or any combination of these.

The first end of the conductive wall may be coupled to the top ground plane, the first dielectric substrate of the first stripline board, the second dielectric substrate of the first stripline board or a combination of them. The second end of the conductive wall may be coupled to the bottom ground plane, the first dielectric substrate of the second stripline board, the second dielectric substrate of the second stripline board or a combination of them.

In some embodiments, the first end of the conductive wall may be coupled to the first dielectric substrate of the first stripline board and the second end of the conductive wall may be coupled to the second dielectric substrate of the second stripline board. In other embodiments, the first end of the conductive wall may be coupled to the top ground plane and the second end of the conductive wall may be coupled to the second dielectric substrate of the second stripline board.

The conductive wall may include conductive materials, such as various metals or printed metals.

As stated above, the conductive wall forms a cavity which encloses the interconnect and outer surfaces of the first and second stripline boards. The cavity may include or be filled with dielectric material. For example, dielectric material may be disposed between the interconnect, outer surfaces of the first and second stripline boards and an inner surface of the conductive wall.

In some embodiments, the first stripline board and the second stripline board can be formed having different lengths such that the outer surface of the second dielectric substrate of the first stripline and the outer surface of the first dielectric substrate of the second stripline form a step shaped surface.

It should be appreciated that although the above fabrication techniques discusses a multilayered PCB having a first and second stripline board, the systems and methods as described herein are not limited to a multilayered PCB having only two stripline boards. For example, a multilayered PCB may be fabricated having any number of stripline boards (e.g., more than two) using the systems and methods described herein, based at least in part on a particular application of the multilayered PCB.

The particular combinations of elements and features in the above-detailed embodiments are exemplary only; the interchanging and substitution of these teachings with other teachings in this and the incorporated-by-reference patents and applications are also expressly contemplated. As those skilled in the art will recognize, variations, modifications, and other implementations of what is described herein can occur to those of ordinary skill in the art without departing from the spirit and the scope of the invention as claimed.

Further, in describing the invention and in illustrating embodiments of the invention in the figures, specific terminology, numbers, dimensions, materials, etc., are used for the sake of clarity. However, the invention is not limited to the specific terms, numbers, dimensions, materials, etc. so selected, and each specific term, number, dimension, material, etc., at least includes all technical and functional equivalents that operate in a similar manner to accomplish a similar purpose. Use of a given word, phrase, number, dimension, material, language terminology, product brand, etc. is intended to include all grammatical, literal, scientific, technical, and functional equivalents. The terminology used herein is for the purpose of description and not limitation.

Having described the preferred embodiments of the invention, it will now become apparent to one of ordinary skill in the art that other embodiments incorporating their concepts may be used. Moreover, those of ordinary skill in the art will appreciate that the embodiments of the invention described herein can be modified to accommodate and/or comply with changes and improvements in the applicable technology and standards referred to herein. For example, the technology can be implemented in many other, different, forms, and in many different environments, and the technology disclosed herein can be used in combination with other technologies. Variations, modifications, and other implementations of what is described herein can occur to those of ordinary skill in the art without departing from the spirit and the scope of the invention as claimed. It is felt therefore that these embodiments should not be limited to disclosed embodiments but rather should be limited only by the spirit and scope of the appended claims.

What is claimed:

1. A multilayered printed circuit board comprising:
   a first stripline board having first and second opposing surfaces, the first stripline having a first conductor formed as a first signal path within the multilayered printed circuit board;
   a second stripline board having first and second opposing surfaces, the second stripline having a second conductor formed as a second signal path within the multilayered printed circuit board;
   a vertical interconnect disposed along portions of an outer surface of the first and second stripline boards, said vertical interconnect having a first end electrically coupled to the first conductor and a second end electrically coupled to the second conductor; and
   an electrically conductive wall formed over the outer surface of the first and second stripline boards to form a cavity which encloses said vertical interconnect and the outer surface of the first and second stripline boards.

2. The multilayered printed circuit board of claim 1, wherein the first stripline board further comprises:
   a first dielectric substrate disposed over a first surface of the first conductor and a second dielectric substrate disposed over a second surface of the first conductor; and
   a first ground plane formed over a first surface of the first dielectric substrate.

3. The multilayered printed circuit board of claim 2, further comprising a conductive layer formed over a second surface of the second dielectric substrate to form a second ground plane of the first stripline board.

4. The multilayered printed circuit board of claim 1, wherein the second stripline further comprises:
   a first dielectric substrate disposed over a first surface of the second conductor and a second dielectric substrate disposed over a second surface of the second conductor; and
   a first ground plane formed over a second surface of the second dielectric substrate.

5. The multilayered printed circuit board of claim 4, further comprising a conductive layer formed over a first surface of the first dielectric substrate to form a second ground plane of the second stripline board.

6. The multilayered printed circuit board of claim 1, wherein the vertical interconnect is formed along an outer surface of a second dielectric substrate of the first stripline board and an outer surface of a first dielectric substrate of the second stripline board.

7. The multilayered printed circuit board of claim 6, wherein the outer surface of the second dielectric substrate of the first stripline board and the outer surface of the first dielectric substrate of the second stripline board are substantially flush.

8. The multilayered printed circuit board of claim 6, wherein the first stripline board and the second stripline board are different lengths such that the outer surface of the second dielectric substrate of the first stripline board and the outer surface of the first dielectric substrate of the second stripline board form a step shaped surface.

9. The multilayered printed circuit board of claim 1, further comprising one or more ramps formed over one or more ground planes within the multilayered printed circuit board, wherein the vertical interconnect is disposed over the one or more ramps to couple the first and second conductor over the step shaped surface.

10. The multilayered printed circuit board of claim 1, wherein the electrically conductive wall is coupled to the first surface of the first stripline board and the second surface of the second stripline board.

11. The multilayered printed circuit board of claim 1, wherein the electrically conductive wall encloses the outer surface such that the cavity is formed between the outer surface of the first and second stripline boards and an inner surface of the electrically conductive wall.

12. The multilayered printed circuit board of claim 1, further comprising dielectric material disposed within the cavity.

13. The multilayered printed circuit board of claim 1, wherein a shape of the interconnect includes at least one of a cylindrical shape, rectangular shape, or conformal to the outer surface of the first and second stripline boards.

14. The multilayered printed circuit board of claim 1, wherein a shape of the electrically conductive wall includes at least one of a cylindrical shape, rectangular shape, or conformal to a surface of the multilayered printed circuit board.

15. A method for forming a multilayered printed circuit board, the method comprising:
   exposing a first signal path on a first layer of a stripline multilayer printed circuit board;
   exposing a second signal path on a second different layer of the stripline multilayer printed circuit board;
   providing a vertical interconnect on side portions of the first and second layers of the stripline multilayer printed circuit board; and
   forming an electrically conductive wall over the side portions of the first and second layers of the stripline multilayer printed circuit board to form a cavity which encloses the vertical interconnect and the side portions of the first and second layers.

16. The method of claim 15, wherein forming the first layer further comprises:
   disposing a first dielectric substrate over a first surface of the first signal path and a second dielectric substrate over a second surface of the first signal path; and
   forming a first ground plane over a first surface of the first dielectric substrate.

17. The method of claim 16, further comprising forming a second ground plane over a second surface of the second dielectric substrate, said second ground plane disposed between the first and second layers.

18. The method of claim 15, wherein forming the second layer further comprises:

disposing a first dielectric substrate over a first surface of the second signal path and a second dielectric substrate over a second surface of the second signal path; and forming a first ground plane over a second surface of the second dielectric substrate.

19. The method of claim 18, further comprising forming a second ground plane over a first surface of the first dielectric substrate, said second ground plane disposed between the first and second layers.

20. The method of claim 15, further comprising disposing the vertical interconnect along an outer surface of a second dielectric substrate of the first layer and an outer surface of a first dielectric substrate of the second layer.

21. The method of claim 20, providing the first layer and the second layer of the multilayer printed circuit board at different lengths such that the outer surface of the second dielectric substrate of the first layer and the outer surface of the first dielectric substrate of the second layer form a step shaped surface.

22. The method of claim 21, further comprising forming a ramp over a portion of the second signal path, wherein the vertical interconnect is formed over a portion of the ramp.

23. The method of claim 21, further comprising forming a first ramp on a conductive layer disposed between the first and second layers and a second ramp over a portion of the second signal path, wherein the vertical interconnect is formed over portions of the first and second ramps.

24. The method of claim 15, further comprising coupling the electrically conductive wall to a first surface of the first layer and a second surface of the second layer.

25. The method of claim 15, further comprising:

forming the cavity between the side portions of the first and second layers and an inner surface of the electrically conductive wall; and disposing dielectric material within the cavity.

* * * * *

UNITED STATES PATENT AND TRADEMARK OFFICE
CERTIFICATE OF CORRECTION

PATENT NO. : 9,974,160 B1
APPLICATION NO. : 15/392142
DATED : May 15, 2018
INVENTOR(S) : Thomas V. Sikina et al.

It is certified that error appears in the above-identified patent and that said Letters Patent is hereby corrected as shown below:

On the Title Page

Item (72), add --Carolyn R. Reistad, Lowell, MA (US)-- as an Inventor.

Item (73), add --The University of Massachusetts, Boston MA (US)-- as an Assignee.

Signed and Sealed this
Thirtieth Day of July, 2019

Andrei Iancu
*Director of the United States Patent and Trademark Office*